United States Patent
Park et al.

(10) Patent No.: US 8,186,297 B2
(45) Date of Patent: May 29, 2012

(54) NOZZLE AND APPARATUS AND METHOD FOR PROCESSING SUBSTRATE USING THE NOZZLE

(75) Inventors: Sung-Woon Park, Seoul (KR); Sang Uk Park, Cheonan (KR); Jae Seung Go, Suwon (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 165 days.

(21) Appl. No.: 12/620,699

(22) Filed: Nov. 18, 2009

(65) Prior Publication Data

US 2010/0130022 A1    May 27, 2010

(30) Foreign Application Priority Data

Nov. 26, 2008   (KR) .................. 10-2008-0118203

(51) Int. Cl.
B05C 11/02   (2006.01)
B05B 7/06   (2006.01)

(52) U.S. Cl. .......... 118/313; 118/315; 118/52; 118/612; 118/319; 118/320

(58) Field of Classification Search .......... 118/52, 118/612, 56, 319, 320, 313–315; 134/153, 134/198, 902; 396/604, 611, 627; 239/601
See application file for complete search history.

(56) References Cited

U.S. PATENT DOCUMENTS 6,830,779 B2 * 12/2004 Shino .................. 427/240
2009/0030022 A1 *  1/2009 Stock et al. ............ 514/272

FOREIGN PATENT DOCUMENTS

| JP | 10-223507      | 8/1998  |
| JP | 11-156246      | 6/1999  |
| JP | 11-165114      | 6/1999  |
| JP | 11-221511      | 8/1999  |
| JP | 2003-080148 A  | 3/2003  |
| JP | 2003-203837    | 7/2003  |
| JP | 2004-014844 A  | 1/2004  |
| KR | 2000-0017366 A | 3/2000  |
| KR | 2002-0016557 A | 3/2002  |
| KR | 10-2004-0102521 A | 12/2004 |
| KR | 10-2007-0007262 A | 1/2007  |

* cited by examiner

Primary Examiner — Yewebdar Tadesse
(74) Attorney, Agent, or Firm — Carter, DeLuca, Farrell & Schmidt LLP

(57) ABSTRACT

A substrate processing apparatus is provided. The substrate processing apparatus includes a substrate supporting member including a spin head on which a substrate is placed, a nozzle discharging processing liquid to the substrate placed on the spin head, and a processing liquid supplying source supplying the processing liquid to the nozzle. The nozzle includes a nozzle main body that has a plurality of discrete discharging openings and an integration discharging opening. The discrete discharging openings have a slit-shaped cross section having a first length and are arrayed in series in a predetermined direction. The integration discharging opening is formed by connecting the discrete discharging openings to each other in a single slot shape having a length greater than the first length, and finally discharges the processing liquid.

16 Claims, 15 Drawing Sheets

Fig. 15A
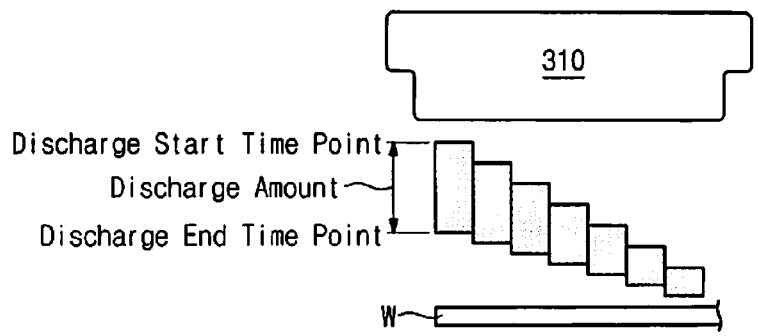
Fig. 15B　　　　　Fig. 15C
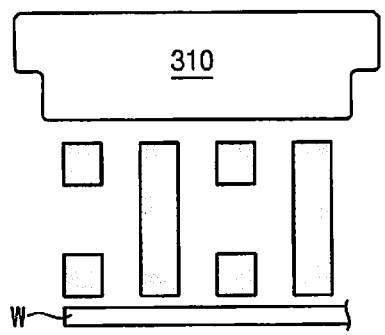 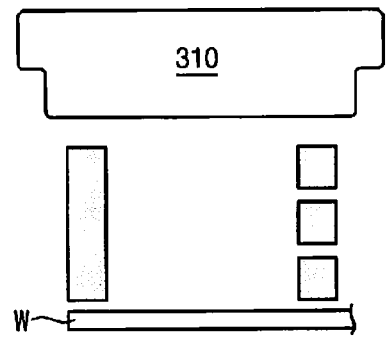
Fig. 15D　　　　　Fig. 15E
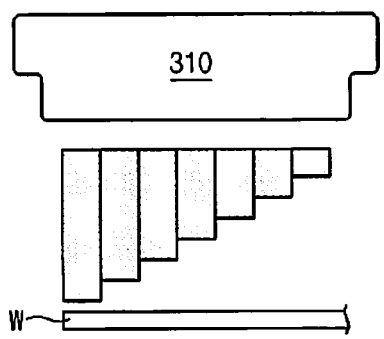 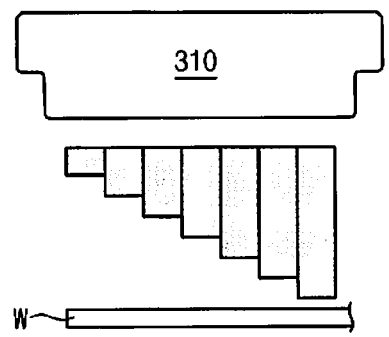

NOZZLE AND APPARATUS AND METHOD FOR PROCESSING SUBSTRATE USING THE NOZZLE

CROSS-REFERENCE TO RELATED APPLICATIONS

This U.S. non-provisional patent application claims priority under 35 U.S.C. §119 of Korean Patent Application No. 10-2008-0118203, filed on Nov. 26, 2008, the entire contents of which are hereby incorporated by reference.

BACKGROUND OF THE INVENTION

The present invention disclosed herein relates to a nozzle performing a developing process by supplying developing liquid on a surface of a substrate after a resist coating process and an exposing process, and an apparatus and a method for processing a substrate using the nozzle.

In general, when a semiconductor device is manufactured, a circuit pattern is formed by coating photoresist on a semiconductor wafer as a target substrate, performing an exposing process to transfer a mask pattern to the photoresist, and developing the photoresist.

When the photoresist is developed, the so-called puddle method is typically used in which developing liquid is continuously supplied from a nozzle to a substrate, and the developing liquid is gathered only for a predetermined time in a pattern-forming surface, so as to develop a pattern of a photoresist layer.

The puddle method widely uses a so-called slit nozzle that has a discharging opening, a length of which is greater than the diameter of a substrate. Developing methods using slit nozzles are classified into a rotating method in which a substrate is rotated through about 180° while discharging developing liquid from a slit nozzle, and a scanning method in which a slit nozzle is moved in a predetermined direction parallel to a substrate without rotating the substrate.

In the rotating method, a substrate is rotated through 180° in the state where a nozzle is fixed. In this case, since fresh developing liquid is always supplied to a center portion of a substrate, the center portion is excessively developed relative to an edge portion.

In the scanning method, developing liquid is supplied to form a puddle in a substrate through a discharging opening having a length greater than the diameter of the substrate. In this case, since the developing liquid is supplied to a region out of the substrate, the developing liquid is wasted, and a process time is increased.

In addition, since a typical nozzle has a single discharging opening, it is difficult to concentrate developing liquid to a specific region.

Furthermore, when a nozzle has a short slit-shaped discharging opening, developing liquid is discharged to a substrate while moving the nozzle. Thus, process uniformity is degraded by vibration due to the moving of the nozzle and driving errors of driving devices.

SUMMARY OF THE INVENTION

The present invention provides a nozzle improving the uniformity of a developing process and line width uniformity, and an apparatus and a method for processing a substrate using the nozzle.

The present invention also provides a nozzle reducing a waste amount of developing liquid, and an apparatus and a method for processing a substrate using the nozzle.

The present invention also provides a single nozzle performing a liquid contact scan process and a specific range discharge process, and an apparatus and a method for processing a substrate using the nozzle.

Embodiments of the present invention provide substrate processing apparatuses including: a substrate supporting member including a spin head on which a substrate is placed; a nozzle discharging processing liquid to the substrate placed on the spin head; and a processing liquid supplying source supplying the processing liquid to the nozzle, wherein the nozzle has a plurality of discrete discharging openings that have a slit-shaped cross section and are arrayed in series in a predetermined direction.

In some embodiments, each of the discrete discharging openings may discretely discharge the processing liquid.

In other embodiments, each of the discrete discharging openings may have round surfaces at both ends in a longitudinal direction of the discrete discharging opening, and have an extension portion at a middle, and the extension portion has a width greater than that of the slit-shaped cross section.

In still other embodiments, the nozzle may include: a main passage connected to the processing liquid supplying source; branch passages respectively connected to the discrete discharging openings from the main passage; and valves respectively provided to the branch passages.

In even other embodiments, the nozzle may include: a distributor configured to distribute the processing liquid to each of the discrete discharging openings; and a controlling part controlling the distributor, and the distributor may include: a main passage connected to the processing liquid supplying source; branch passages connecting the main passage to each of the discrete discharging openings; and valves opening and closing the branch passages according to signals provided from the controlling part.

In yet other embodiments, the discrete discharging openings may have neighboring side surfaces that are in surface contact with each other, and a sum of lengths of the discrete discharging openings may be equal to or greater than a radius of the substrate, and less than a diameter of the substrate.

In other embodiments of the present invention, substrate processing apparatuses include: a substrate supporting member including a spin head on which a substrate is placed; a nozzle discharging processing liquid to the substrate placed on the spin head; and a processing liquid supplying source supplying the processing liquid to the nozzle, wherein the nozzle includes a nozzle main body that has a plurality of discrete discharging openings and an integration discharging opening, the discrete discharging openings have a slit-shaped cross section having a first length and are arrayed in series in a predetermined direction, and the integration discharging opening is formed by connecting the discrete discharging openings to each other in a single slot shape having a length greater than the first length, and finally discharges the processing liquid.

In some embodiments, the substrate processing apparatuses may further include: an arm on which the nozzle is rotatably installed to adjust a discharge angle of the processing liquid discharged from the integration discharging opening; and an angle adjusting driving part adjusting the discharge angle of the nozzle installed on the arm.

In other embodiments, the nozzle may include: a distributor connected to the nozzle main body and configured to distribute the processing liquid, supplied from the processing liquid supplying source, to each of the discrete discharging openings; and a nozzle controlling part controlling the distributor.

In still other embodiments, the distributor may include: a main passage connected to the processing liquid supplying source; branch passages connecting the main passage to each of the discrete discharging openings; and valves opening and closing the branch passages according to signals provided from the nozzle controlling part.

In even other embodiments, the nozzle controlling part may control the distributor to adjust a discharge start time point and a discharge end time point of each of the discrete discharging openings.

In yet other embodiments, the discrete discharging openings disposed at both ends of the nozzle main body may discharge the processing liquid to an edge region of the substrate and a center region of the substrate.

In further embodiments, the integration discharging opening may have a length that is equal to or greater than a radius of the substrate, and less than a diameter of the substrate.

In still further embodiments, a discharge position of the nozzle may extend along an eccentric line parallel to and spaced a predetermined distance from a center line connecting an edge of the substrate to a rotation center of the substrate.

In even further embodiments, the nozzle main body may have first and second inner surfaces corresponding to a long side of the discrete discharging opening, and third and fourth round inner surfaces corresponding to a short side thereof.

In yet further embodiments, the first and second inner surfaces may have an extension portion having a width greater than that of the slit-shaped cross section.

In still other embodiments of the present invention, nozzles discharging processing liquid to a substrate include: a main passage; discrete discharging openings through which the processing liquid is discharged; branch passages connecting the main passage to each of the discrete discharging openings; and valves respectively installed on the branch passages, wherein the discrete discharging openings are arrayed in a predetermined direction.

In some embodiments, the nozzle may have an integration discharging opening that is formed by connecting the discrete discharging openings to each other in a single slot shape, and that finally discharges the processing liquid.

In other embodiments, each of the discrete discharging openings may have round surfaces at both ends in a longitudinal direction of the discrete discharging opening, and have an extension portion at a middle, and a width of the extension portion is greater than that of the slot shape.

In even other embodiments of the present invention, methods for discharging processing liquid to a substrate include: preparing the substrate; preparing a nozzle having an integration discharging opening that is formed by connecting discrete discharging openings, having short slit shapes arrayed in a straight line, to each other in a single long slit shape, the processing liquid being discharged through the integration discharging opening; positioning the nozzle on the substrate such that the discrete discharging openings cover a region ranging from an edge region of the substrate to a center region of the substrate; and discharging the processing liquid to the rotated substrate in a state of fixing a position of the nozzle.

In some embodiments, in the discharging of the processing liquid, at least two of the discrete discharging openings may be different from each other in one of discharge amount and discharge time.

In other embodiments, the discrete discharging openings may be different from each other in discharge start time point and discharge end time point.

In still other embodiments, neighboring ones of the discrete discharging openings may partially overlap each other in discharge time.

In even other embodiments, the discrete discharging openings may be the same in discharge start time point, and different in discharge end time point.

In yet other embodiments, when two of the discrete discharging openings are adjacent to each other, a discharge start time point of the discrete discharging opening close to a center of the substrate may be disposed between a discharge start time point of the discrete discharging opening close to an edge of the substrate and a discharge end time point thereof, and a discharge end time point of the discrete discharging opening close to the center of the substrate may be later than the discharge end time point of the discrete discharging opening close to the edge of the substrate.

In further embodiments, the processing liquid may be sequentially discharged through the discrete discharging openings in order from the discrete discharging opening close to an edge of the substrate to the discrete discharging opening close to a center of the substrate.

In still further embodiments, the discharging of the processing liquid may include repeatedly discharging the processing liquid through the discrete discharging opening close to the center of the substrate.

In even further embodiments, the discharging of the processing liquid may include rotating the nozzle to adjust a discharge angle of the processing liquid discharged from the discrete discharging openings.

In yet further embodiments, the discharge angle of the processing liquid discharged from the discrete discharging openings may be inclined in a rotation direction of the substrate.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIGS. 15A through 15E are schematic views illustrating various discharging methods of a nozzle according to an embodiment of the present invention;

DETAILED DESCRIPTION OF PREFERRED EMBODIMENTS

Figure 1:
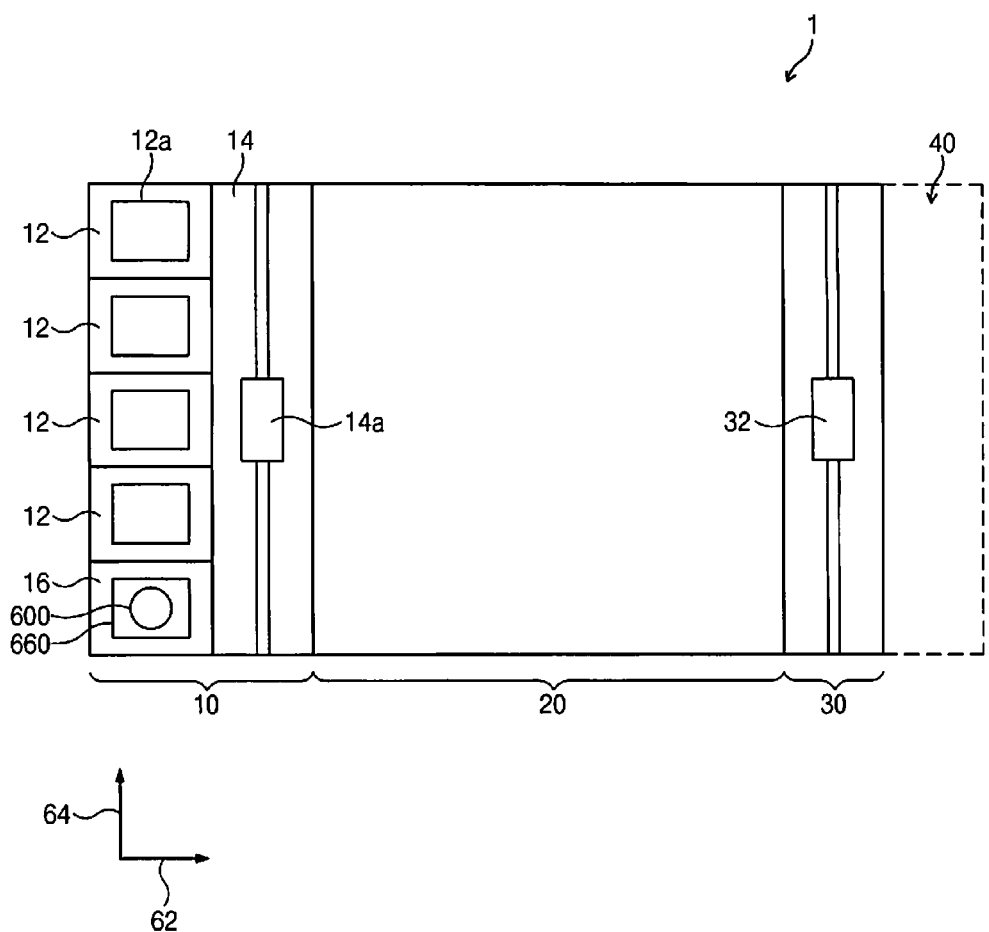
FIG. 1 is a schematic view illustrating a substrate processing apparatus according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout. Moreover, detailed descriptions related to well-known functions or configurations will be ruled out in order not to unnecessarily obscure subject matters of the present invention.

Embodiment

A semiconductor substrate is used as a substrate processed by a substrate processing apparatus 1 according to an embodiment of present invention. However, the spirit and scope of the present invention is not limited thereto, and thus, various substrates including a glass substrate may be used as substrates processed by the substrate processing apparatus 1.

FIG. 1 is a schematic view illustrating the substrate processing apparatus 1 that performs a photolithography process on a substrate.

Referring to FIG. 1, the substrate processing apparatus 1 includes an index section 10, a processing section 20, and an interface section 30 that are sequentially arranged along a predetermined direction (hereinafter, referred to as a first direction 62). The index section 10 includes cassette supports 12 and a robot path 14.

Cassettes 12a accommodating semiconductor substrates, such as wafers, are placed on the cassette supports 12. A robot 14a, transporting a wafer between the cassettes 12a placed on the cassette supports 12 and the processing section 20, is installed in the robot path 14. The robot 14a is movable along a perpendicular direction (hereinafter, referred to as a second direction 64) to the first direction 62 on a horizontal plane, rotatable about a vertical axis, and movable along an up-and-down direction. Since a structure moving the robot 14a along the horizontal direction and the up-and-down direction is well known to those skilled in the art, a description thereof will be omitted.

The processing section 20 performs a coating process in which photosensitive liquid such as photoresist is applied to a wafer, and a developing process in which an exposed region or the region except for the exposed region is removed from a wafer leaving a light exposure process. The processing section 20 includes coating units 70, developing units 80, and baking units 50.

The interface section 30 connected to a light exposure section 40 is disposed on a side of the processing section 20. A robot 32, transporting a wafer between the light exposure section 40 and the processing section 20, is disposed in the interface section 30. The robot 32 is movable along the second direction 64 and the up-and-down direction.

Figure 2:
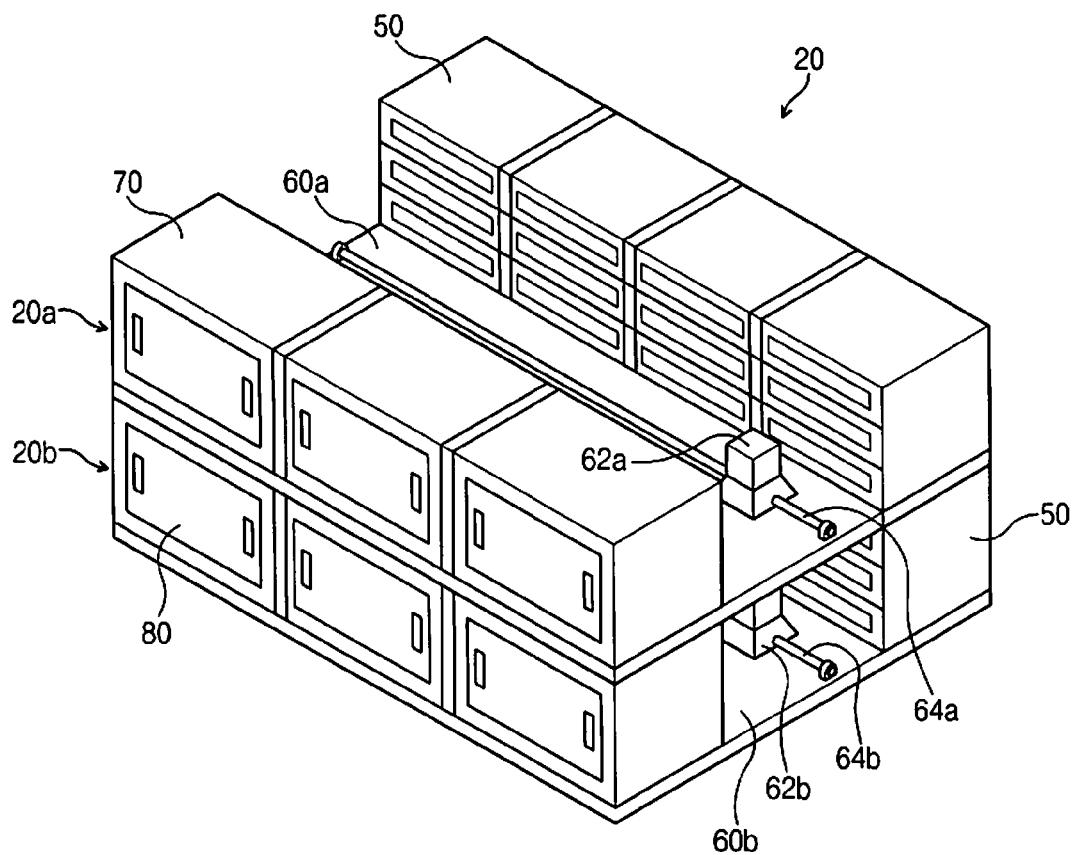
FIG. 2 is a perspective view illustrating a processing section in the substrate processing apparatus of FIG. 1.

FIG. 2 is a perspective view illustrating the processing section 20 of FIG. 1.

The processing section 20 includes a first processing chamber 20a and a second processing chamber 20b that have a stack structure. The first processing chamber 20a is provided with units performing the coating process, and the second processing chamber 20b is provided with units performing the developing process. That is, the first processing chamber 20a is provided with the coating units 70 and the baking units 50, and the second processing chamber 20b is provided with the developing units 80 and the baking units 50. For example, the first processing chamber 20a is disposed on the upper portion of the second processing chamber 20b. Alternatively, the first processing chamber 20a may be disposed on the lower portion of the second processing chamber 20b.

Accordingly, a wafer is sequentially moved to the index section 10, the first processing chamber 20a, the interface section 30, the second processing chamber 20b, and the index section 10. That is, when the photolithography process is performed, a wafer is moved in a loop along the up-and-down direction.

Figure 3:
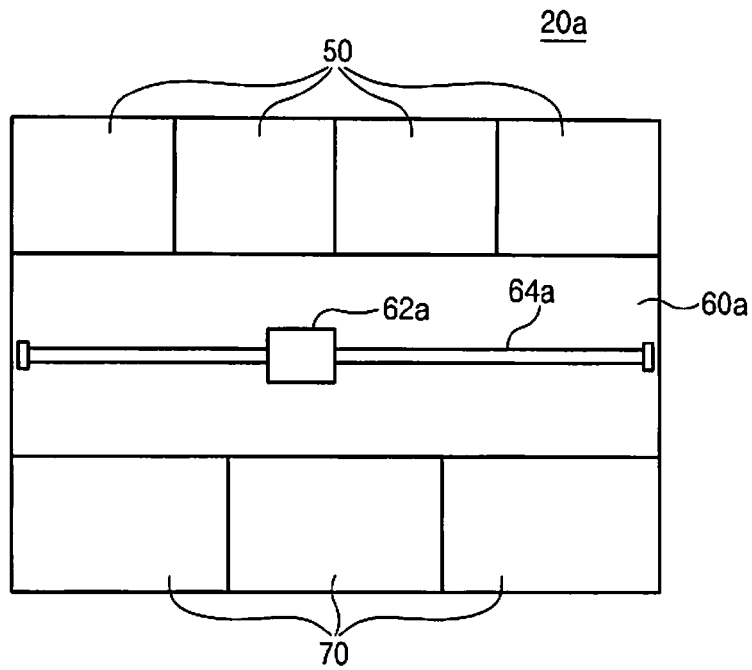
FIG. 3 is a plan view illustrating a first processing chamber in the processing section of FIG. 2.

FIG. 3 is a plan view illustrating the first processing chamber 20a.

Referring to FIG. 3, a first path 60a extends along the first direction 62 in the middle of the first processing chamber 20a. An end of the first path 60a is connected to the index section 10, and the other end thereof is connected to the interface section 30. A side of the first path 60a is provided with the baking units 50 that are arrayed in a straight line along the first path 60a. Another side of the first path 60a is provided with the coating units 70 that are arrayed in a straight line along the first path 60a. Furthermore, the baking units 50 and the coating units 70 are stacked along the up-and-down direction. The first path 60a is provided with a first robot 62a that transports a wafer between the interface section 30, the coating units 70, the baking units 50, and the index section 10. The first path 60a is provided with a guide rail 64a to move the first robot 62a in a straight line along the first direction 62.

For example, the baking units 50 of the first processing chamber 20a may perform a pre-baking process in which a substrate is heated at a predetermined temperature before coating photoresist, so as to remove organic material or moisture from the surface of a substrate, a soft-baking process after coating photoresist on a substrate, and a cooling process on a substrate.

Figure 4:
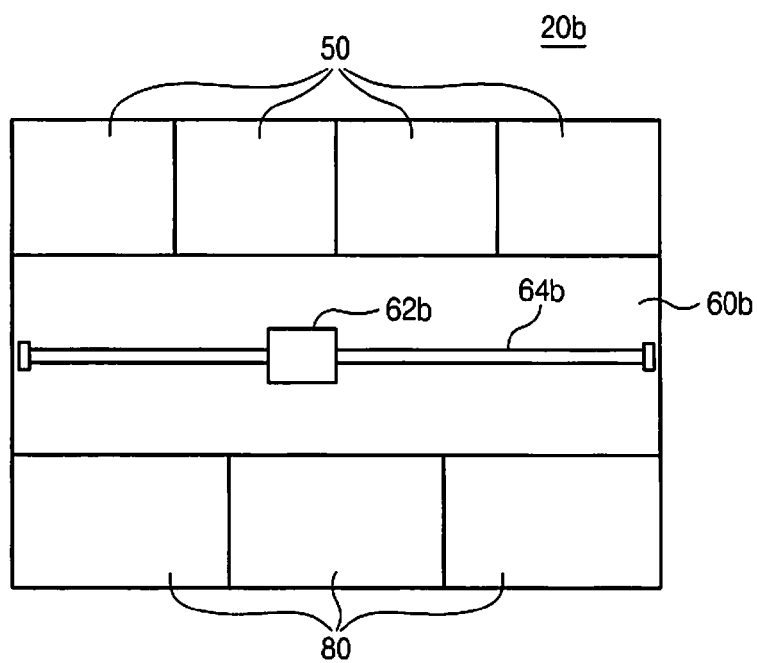
FIG. 4 is a plan view illustrating a second processing chamber in the processing section of FIG. 2.

FIG. 4 is a plan view illustrating the second processing chamber 20b.

Referring to FIG. 4, a second path 60b extends along the first direction 62 in the middle of the second processing chamber 20b. An end of the second path 60b is connected to the index section 10, and the other end thereof is connected to the interface section 30. A side of the second path 60b is provided with the baking units 50 that are arrayed in a straight line along the second path 60b. Another side of the second path 60b is provided with the developing units 80 that are arrayed in a straight line along the second path 60b. Furthermore, the baking units 50 and the developing units 80 are stacked along the up-and-down direction. The second path 60b is provided with a second robot 62b that transports a wafer between the interface section 30, the developing units 80, the baking units 50, and the index section 10.

For example, the baking units 50 of the second processing chamber 20b may perform a hard-baking process after developing photoresist changed through light irradiation, a post exposure baking process after exposing photoresist to a light source, and a cooling process on a substrate.

The second path 60b is provided with a guide rail 64b to move the second robot 62b in a straight line along the first direction 62. Alternatively, a first path may be disposed on a side of a first processing chamber, and coating units and baking units may be disposed on another side of the first processing chamber, and a second path may be disposed on a side of a second processing chamber, and developing units and baking units may be disposed on another side of a second processing chamber.

Figure 5:
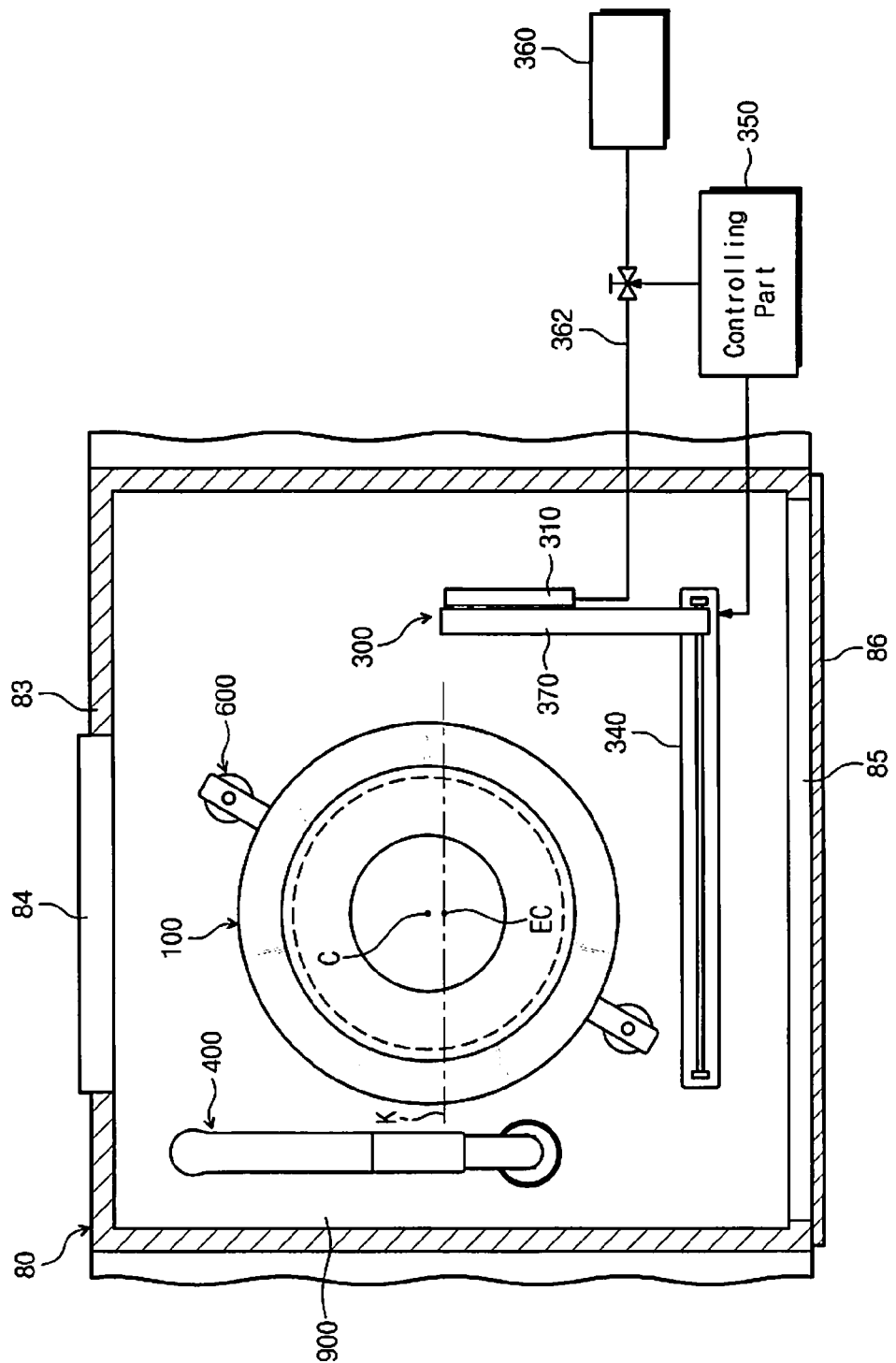
FIGS. 5 and 6 are a plan view and a side view illustrating the configuration of developing unit according to an embodiment of the present invention.
Figure 6:
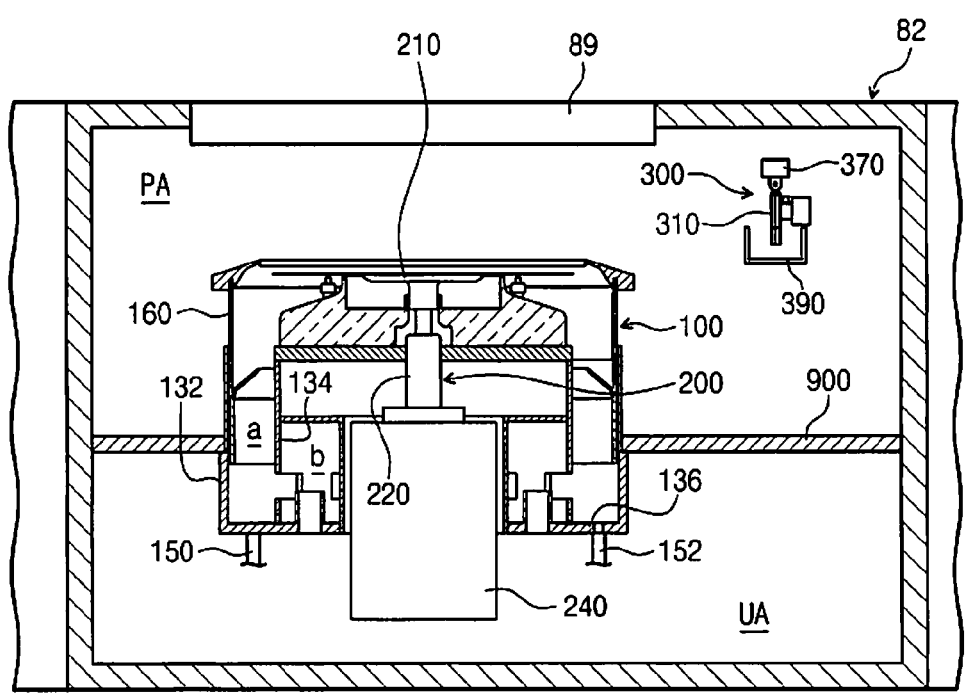

FIGS. 5 and 6 are a plan view and a side view illustrating the configuration of the developing unit 80. Although the developing unit 80 is exemplified in the current embodiment, a coating unit or a unit, performing cleaning and etching processes in which various processing fluids are used to remove foreign substances and layers from the surface of a substrate, may be exemplified. A cleaning nozzle is omitted for convenience in FIG. 6.

Referring to FIGS. 5 and 6, the developing unit 80 includes a chamber 82, a processing container 100, a substrate supporting member 200, and a nozzle member 300.

The chamber 82 provides a sealed inner space. A fan filter unit 89 is installed in the upper portion of the chamber 82. The fan filter unit 89 generates a vertical air flow in the chamber 82. A substrate port 84 is disposed in a surface 83 of the chamber 82 adjacent to the second path 60b. An open surface 85 for maintenance is disposed in a surface facing the surface 83 provided with the substrate port 84, and covered with a cover 86.

The fan filter unit 89 is a module including a filter and an air supplying fan in a single unit, which filters air to supply fresh air to the chamber 82. The fresh air is supplied into the chamber 82 through the fan filter unit 89, so as to generate a vertical air flow that is uniformly provided to the upper portion of a substrate.

Referring to FIG. 6, the chamber 82 is divided into a processing area PA and a utility area UA by a base 900 that is provided with the processing container 100 and the nozzle member 300. Although not completely shown, a discharging line 141 and an exhausting line 148 connected to the processing container 100, and various pipes connected to the nozzle member 300 and a driving part of an elevating unit are disposed in the utility area UA. The processing area PA may be separated from the utility area UA to achieve high freshness.

The processing container 100 is installed on the base 900, and has a cylindrical shape with an open upper portion, and provides a processing space for processing a substrate W. An open upper surface of the processing container 100 is used as a loading/unloading passage for the wafer W. The processing container 100 surrounds the substrate supporting member 200. The processing container 100 is used to introduce and collect fluids (developing liquid, cleaning liquid, and dry gas) splashed from the wafer W rotated during developing, cleaning, and drying processes for the wafer W. The processing container 100 prevents external apparatuses or surroundings from being polluted, collects developing liquid, and provides a uniform air flow on the upper portion of a substrate.

The processing container 100 has an outer space 'a' and an inner space 'b'. Developing liquid and gas splashed from the wafer W are introduced into the outer space 'a' that is defined by an outer wall 132 and a vertical wall 134, and a bottom wall 136. A discharging line 150 for draining developing liquid is connected to the bottom wall 136. An exhausting line 152 for exhausting gas is connected to a bottom surface of the inner space 'b' of the processing container 100.

An elevatable ring-shaped cover 160 is installed on the outer wall 132. An elevating unit 600 moves the cover 160 up and down to load or unload the substrate W on a spin head 210, so that the cover 160 is disposed at a position over a substrate or a position under a substrate.

The elevating unit 600 moves the processing container 100 up and down in a straight line, so as to vary a relative height of the processing container 100 to the spin head 210. When the substrate W is loaded or unloaded from the spin head 210, the cover 160 moves downward such that the spin head 210 protrudes out of the upper portion of the processing container 100.

According to the current embodiment, the substrate processing apparatus 1 vertically moves the processing container 100 to vary a relative vertical position between the processing container 100 and the substrate supporting member 200. Alternatively, the substrate processing apparatus 1 may vertically move the substrate supporting member 200 to vary a relative vertical position between the processing container 100 and the substrate supporting member 200.

The substrate supporting member 200 is installed in the processing container 100. The substrate supporting member 200 supports the substrate W during a process, and may be rotated during a process by a driver 240 that will be described later. The substrate supporting member 200 includes the spin head 210 that has a flat upper surface on which the substrate W is placed. The spin head 210 accommodates a vacuum line (not shown) such that the spin head 210 may directly attract a substrate to prevent centrifugal force from removing a substrate out of the spin head 210. Alternatively, the substrate supporting member 200 may mechanically fix edges adjacent to the lateral surface of a substrate through chucking pins installed on the spin head 210. A spindle 220 is fixed to the lower surface of the spin head 210, and rotated by the driver 240. Although not shown, the driver 240 includes a motor, a belt, and a pulley that are used to supply torque.

The nozzle member 300 is used to discharge developing liquid to a substrate, and includes a nozzle 310, an arm 370 provided with the nozzle 310, an arm driving part 340 moving the arm 370, and a controlling part 350 controlling the arm driving part 340. The nozzle 310 receives developing liquid through a fluid channel (supply line) 362 from a processing liquid supplying source 360.

The arm 370 may be moved horizontally by the arm driving part 340 extending in an x-axis direction on the base 900, and moved vertically to adjust the height thereof.

The controlling part 350 controls a driving operation of the arm driving part 340 of the nozzle member 300, and developing liquid supplying of the processing liquid supplying source 360.

The nozzle member 300 includes a nozzle bath 390 that is used to clean the nozzle 310 when the nozzle 310 is disposed at a waiting position. The nozzle bath 390 uses nitrogen gas and cleaning liquid to remove contaminants such as chemical liquid from the end of the nozzle 310.

Figure 7:
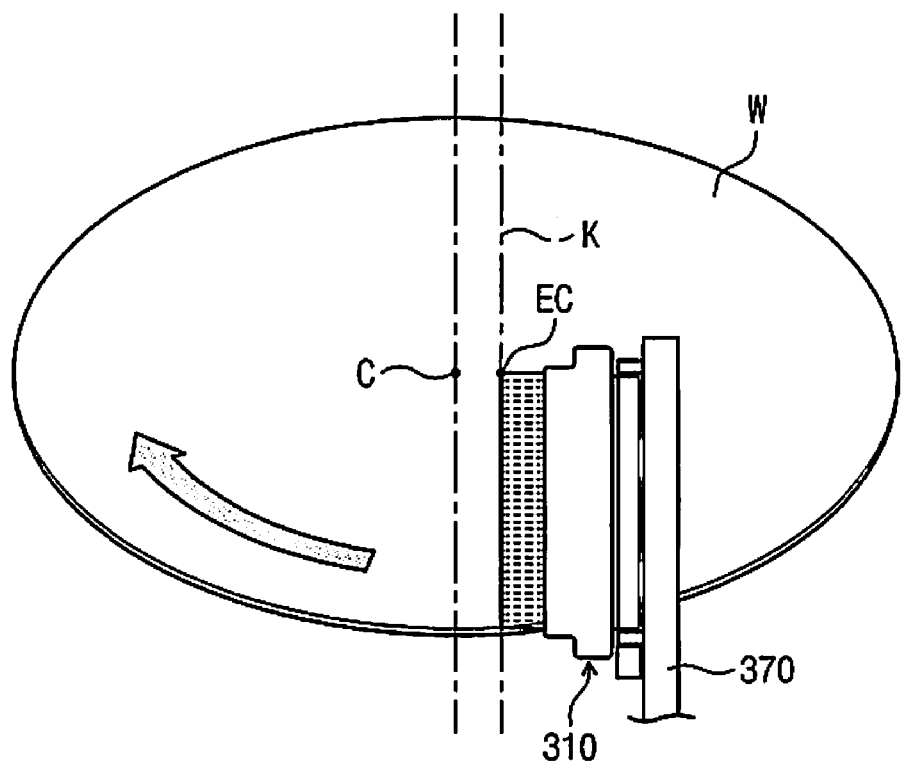
FIG. 7 is a schematic view illustrating a developing liquid discharging line of a nozzle for a substrate according to an embodiment of the present invention.

FIG. 7 is a schematic view illustrating a developing liquid discharging line K of the nozzle 310 for the substrate W.

Referring to FIG. 7, the developing liquid discharging line K is a straight line connecting the edge of the substrate W to a portion adjacent to the center thereof, that is, to an eccentric center EC spaced a predetermined distance from a rotation center C of the substrate W to prevent developing liquid from being directly discharged to the rotation center C of the substrate W. The eccentric center EC may be spaced a distance ranging from about 1 mm to about 30 mm from the rotation center C of the substrate W.

In other words, the nozzle 310 discharges developing liquid on a line that is spaced a distance ranging from about 1 mm to about 30 mm from a center line passing through the rotation center C of the substrate W.

Figure 8:
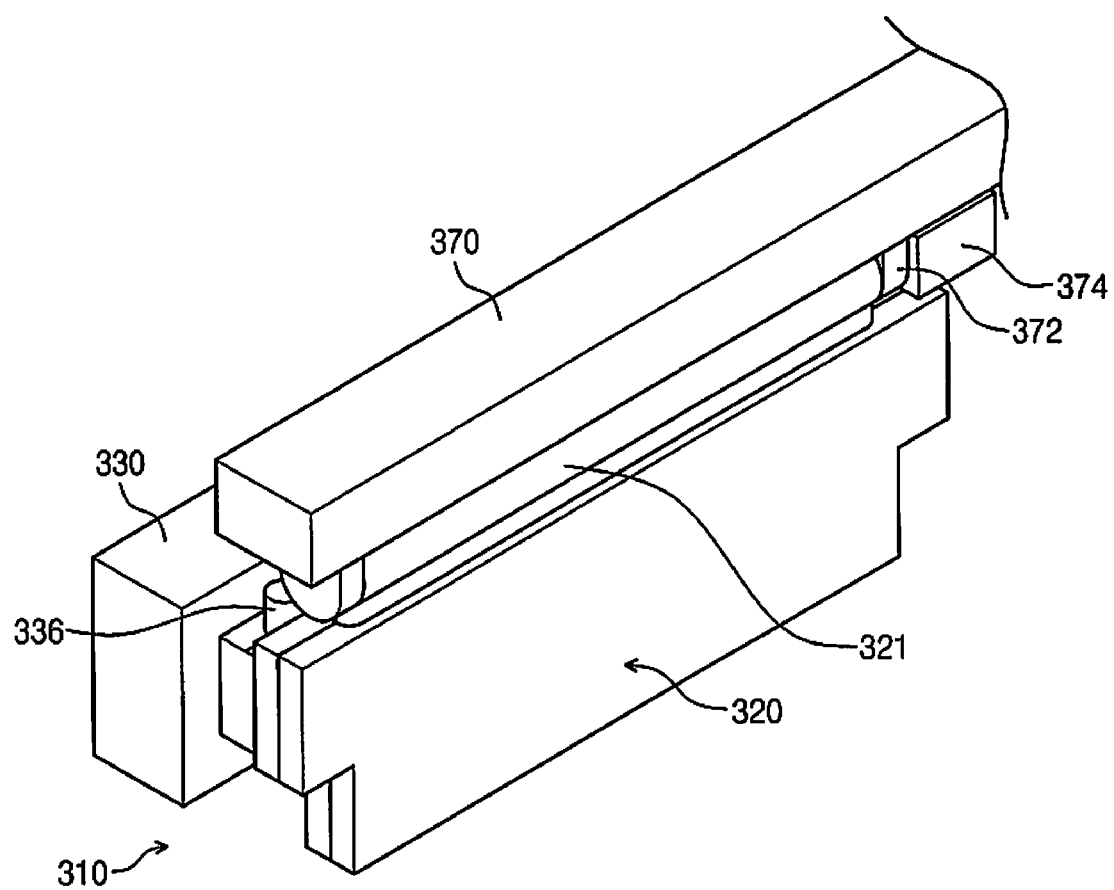
FIG. 8 is a perspective view illustrating a nozzle installed on an arm according to an embodiment of the present invention.
Figure 9:
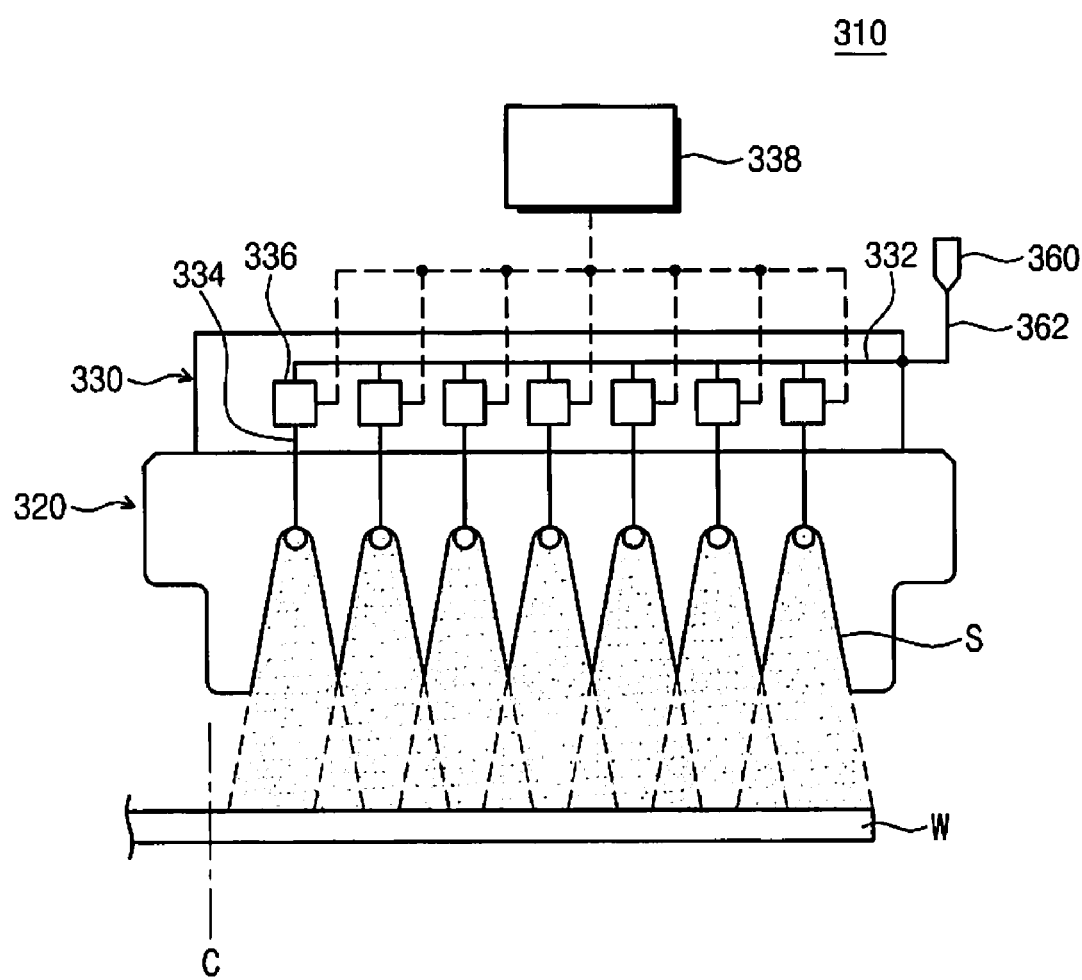
FIG. 9 is a schematic view illustrating the configuration of a nozzle according to an embodiment of the present invention.
Figure 10:
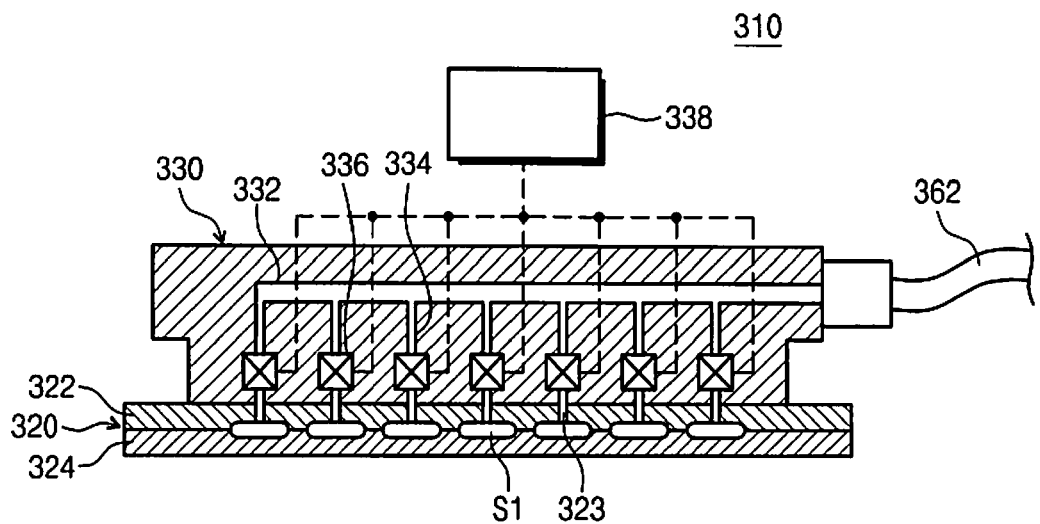
FIGS. 10 and 11 are a horizontal cross-sectional view and a vertical cross-sectional view illustrating the configuration of the nozzle of FIG. 8.
Figure 11:
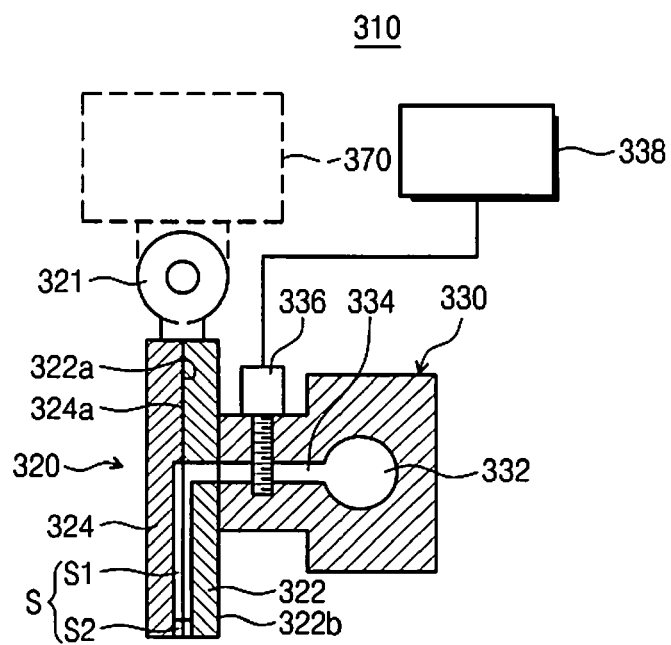
Figure 12:
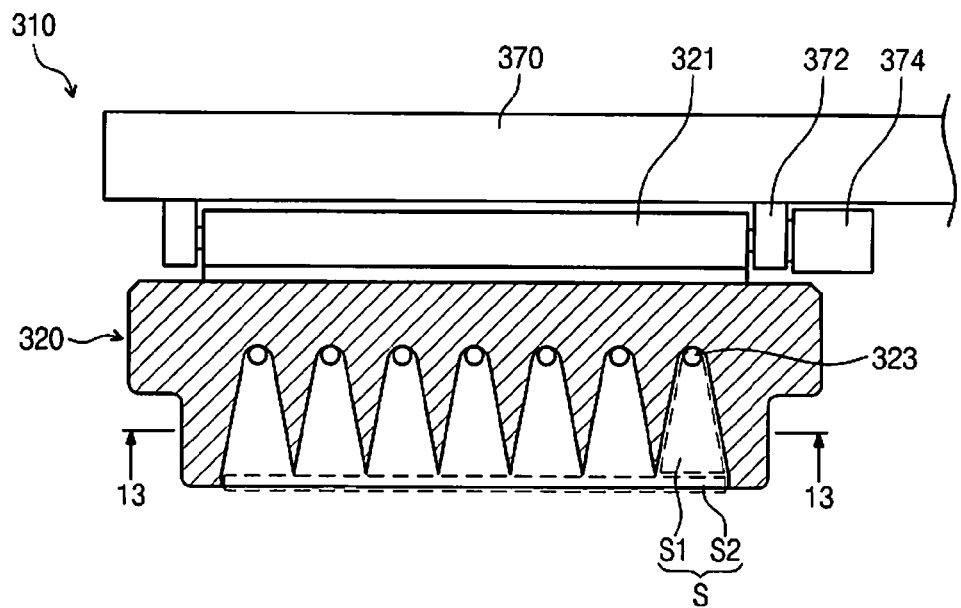
FIG. 12 is a front cross-sectional view illustrating the configuration of the nozzle of FIG. 8.
Figure 13:
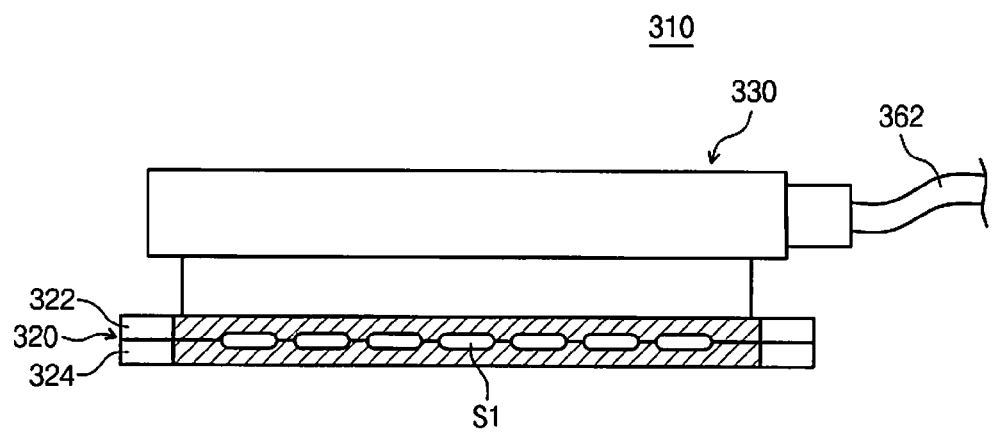
FIG. 13 is a cross-sectional view taken along line 13-13 of FIG. 12.

FIG. 8 is a perspective view illustrating the nozzle 310 installed on the arm 370. FIG. 9 is a schematic view illustrating the configuration of the nozzle 310. FIGS. 10 and 11 are a horizontal cross-sectional view and a vertical cross-sectional view illustrating the configuration of the nozzle 310 of FIG. 8. FIG. 12 is a front cross-sectional view illustrating the configuration of the nozzle 310 of FIG. 8. FIG. 13 is a cross-sectional view taken along line 13-13 of FIG. 12.

Referring to FIGS. 8 through 13, a developing liquid discharging length of the nozzle 310 may be greater than the radius of the substrate W, and less than the diameter of the substrate W. According to the current embodiment, the developing liquid discharging length of the nozzle 310 may correspond to the radius of the substrate W.

The nozzle 310 is coupled to a hinge shaft 372 of the arm 370. The hinge shaft 372 is parallel to the longitudinal direction of the nozzle 310. The arm 370 is provided with an angle adjusting driving part 374 rotating the nozzle 310. The angle adjusting driving part 374 rotates the nozzle 310 about the hinge shaft 372 to adjust a discharge angle of developing liquid discharged from the nozzle 310.

Figure 14A:
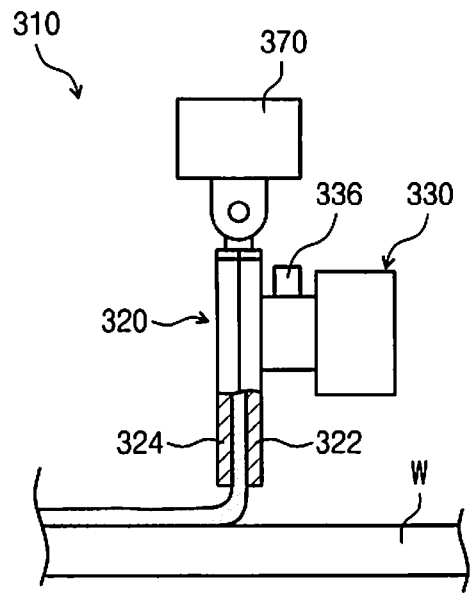
FIG. 14A is a schematic view illustrating a nozzle contacting a substrate through liquid and discharging developing liquid, according to an embodiment of the present invention.

The discharge angle of developing liquid discharged from the nozzle 310 may be varied according to a method of discharging developing liquid to the substrate W. For example, when the nozzle 310 in liquid contact with the substrate W discharges developing liquid as illustrated in FIG. 14A, the discharge angle of developing liquid may be perpendicular to the surface of the substrate W. When the nozzle 310 spaced apart from the substrate W discharges developing liquid as illustrated in FIG. 14B, the discharge angle of developing liquid may be inclined in a rotation direction of the substrate W to protect the nozzle 310 from splash of developing liquid due to a drop.

In other words, since the discharge angle of developing liquid of the nozzle 310 is inclined in the rotation direction of the substrate W, centrifugal force of the substrate W spreads developing liquid discharged to the substrate W to an opposite side of the substrate W to the nozzle 310. That is, since the rotation direction of the substrate W is the same as a discharging direction of developing liquid, the remainder of the developing liquid is quickly discharged to the outside of the substrate W. The nozzle 310 is prevented from being contaminated by developing liquid rebounded from the substrate W.

Figure 14B:
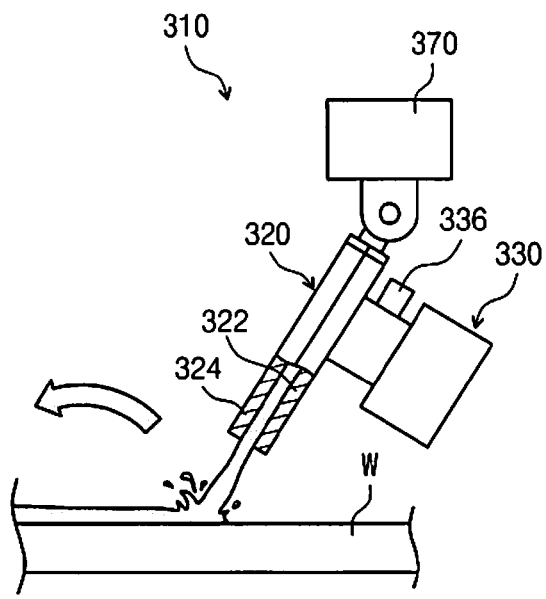
FIG. 14B is a schematic view illustrating a nozzle spaced apart from a substrate and discharging developing liquid, according to an embodiment of the present invention.

Since the nozzle 310 adjusts the discharging angle of developing liquid, the nozzle 310 is adapted for both a liquid contact type discharging process (refer to FIG. 14A) and a space type discharging process (refer to FIG. 14B).

The nozzle 310 includes a nozzle main body 320, a distributor 330, and a nozzle controlling part 338.

The nozzle main body 320 includes a first plate 322 and a second plate 324 that overlap each other to form a single body. The nozzle main body 320 includes a hinge part 321 at the upper end thereof, and the hinge part 321 is coupled to the hinge shaft 372 of the arm 370. A gap is disposed between the first plate 322 and the second plate 324 to provide discharging openings S that discharge developing liquid in band shape.

The discharging openings S are classified into discrete discharging openings S1 having thin and short slit shapes, and an integration discharging opening S2 having a single long slit shape extending from the discrete discharging openings S1 to finally discharge developing liquid. Neighboring inner surfaces of the discrete discharging openings S1 are in surface contact with each other. The longitudinal direction of the discharging openings S is perpendicular to a moving direction of the arm 370.

A first surface 322a of the first plate 322 is in close contact with a first surface 324a of the second plate 324. The distributor 330 is coupled to a second surface 322b of the first plate 322. The first plate 322 has introducing openings 323 that are disposed at the upper ends of the discrete discharging openings S1 and connected to branch passages 334 of the distributor 330.

The nozzle 310 has a two-stage discharging structure that includes the discrete discharging openings S1 increasing in width downward, and the integration discharging opening S2 integrated in a single space under the discrete discharging openings S1, thus preventing blanking of developing liquid at boundaries between the discrete discharging openings S1.

The distributor 330 includes a main passage 332 receiving developing liquid from the supplying line 362 of the processing liquid supplying source 360, the branch passages 334 connecting the main passage 332 to the discrete discharging openings S1, and valves 336 opening and closing the branch passages 334 according to signals supplied from the nozzle controlling part 338. The valves 336 are installed on the branch passages 334.

The nozzle 310 configured as described above is adapted for liquid contact scanning, discrete section discharging, and sequential discharging, and controls a discharge start time point and a discharge end time point according to sections.

FIGS. 15A through 15E are schematic views illustrating various discharging methods of the nozzle 310.

Referring to FIG. 15A, the nozzle 310 sequentially discharges developing liquid from the discrete discharging opening S1 close to the edge of the substrate W to the discrete discharging opening S1 disposed at the center of the substrate W. That is, a discharge start time point of a late discharging one of the discrete discharging openings S1 is disposed between a discharge start time point and a discharge end time point of an early discharging one of the discrete discharging openings S1, and a discharge end time point of the late discrete discharging opening S1 is later than the discharge end time point of the early discrete discharging opening S1. A discharge amount is decreased from the discrete discharging opening S1 closest to the edge of the substrate W to the center of the substrate W.

As described above, the nozzle 310 may discretely and sequentially discharge developing liquid in relay manner from the edge of the substrate W to the center thereof. When the discharging is completed from the edge of the substrate W to the center thereof, the discrete discharging opening S1 closest to the center of the substrate W performs a repeat discharge process in which the supplying and cutting off of developing liquid are alternately repeated.

As such, a sequentially discharging method, in which developing liquid is discharged on the substrate W in the state where the nozzle 310 is fixed and the substrate W is rotated, is the same in effect as a scan method in which a short slit nozzle moves from the edge of a substrate to the center thereof to discharge developing liquid.

Since developing liquid is discharged in scan manner from the edge of the substrate W to the center thereof without the moving of the nozzle 310, vibration or transport error due to the moving of a nozzle can be reduced.

Referring to FIG. 15B, the nozzle 310 may perform a repeating and alternating discharge operation in a desired specific range. Referring to FIG. 15C, the nozzle 310 may perform a continuous discharge operation in a specific range and a discrete discharge operation in another specific range.

Referring to FIGS. 15D and 15E, discharge start time points of the discrete discharging openings S1 are the same, but discharge end time points of the discrete discharging openings S1 are sequentially varied from the discrete discharging opening S1 close to the edge of the substrate W (or from the discrete discharging opening S1 close to the center of the substrate W), so as to uniformly discharge developing liquid on the substrate W.

Figure 16A:
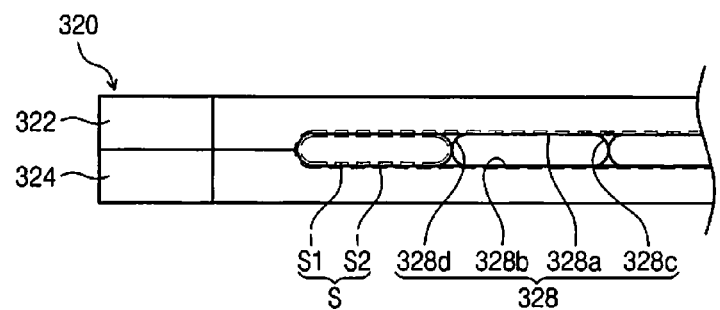
FIG. 16A is a bottom view illustrating a portion of a nozzle main body according to an embodiment of the present invention.
Figure 16B:
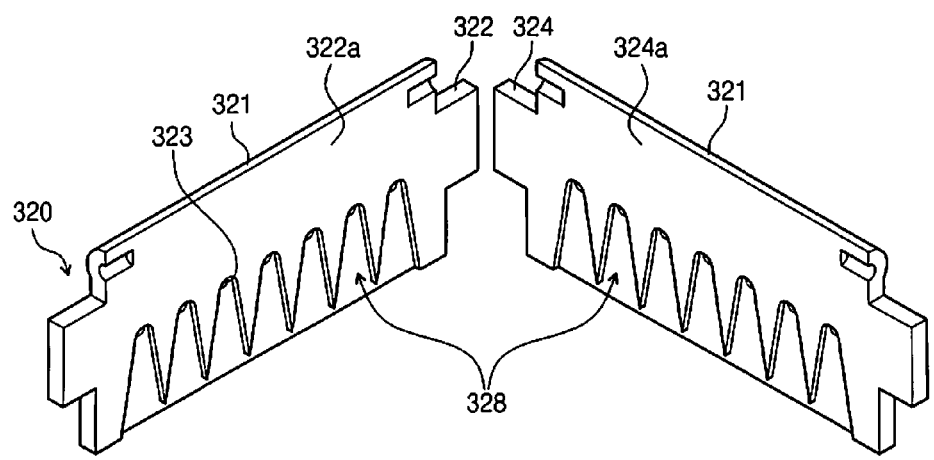
FIG. 16B is a perspective view illustrating coupling surfaces of first and second plates having discharging openings, according to an embodiment of the present invention.

FIG. 16A is a bottom view illustrating a portion of the nozzle main body 320. FIG. 16B is a perspective view illustrating coupling surfaces of the first and second plates 322 and 324 having discharging openings.

Referring to FIGS. 16A and 16B, each of the coupling surfaces (the first surfaces 322a and 324a) of the first plate 322 and the second plate 324 is provided with recesses 328 for providing the discrete discharging openings S1. The recesses 328 gradually increase in width from the introducing holes 323 to the integration discharging openings S2.

Each of the recesses 328 of the first plate 322 and the second plate 324 has first and second straight inner surfaces 328a and 328b corresponding to long sides of the discrete discharging opening S1, and third and fourth round inner surfaces 328c and 328d corresponding to short sides thereof.

Since the nozzle 310 can discharge developing liquid by sections respectively of the discrete discharging openings S1, a discharge cross section of developing liquid is varied according to the shapes of the discrete discharging openings S1. The discrete discharging opening S1 has both round ends (the third and fourth inner surfaces 328c and 328d) to prevent developing liquid from being conglomerated at both the ends of the discrete discharging opening S1 while the developing liquid is discharged, and to prevent slimming of the middle portion of the discrete discharging opening S1 except for both the ends (refer to FIGS. 18A and 18B).

The first plate 322 and the second plate 324 are replaceable to vary the shapes of the recesses 328, and thus adjusting an injection amount of developing liquid and a discharge shape of developing liquid. That is, when the depth of the recess 328 is increased, the width of a discharging opening is increased, so that a discharge amount of developing liquid is increased. On the contrary, when the depth of the recess 328 is decreased, the width of a discharging opening is decreased, so that a discharge amount of developing liquid is decreased. A discharge length of a section may be varied according to the length of the recess 328. The lengths of the recesses 328 may be decreased to precisely control a discharge section of developing liquid on a substrate. Since the first plate 322 and the second plate 324 are in direct contact with developing liquid, the first plate 322 and the second plate 324 may be formed of resin having high water repellency, such as polychlorotrifluoroethylene (PCTFE), and hydrophilic material such as quartz.

Figure 17A:
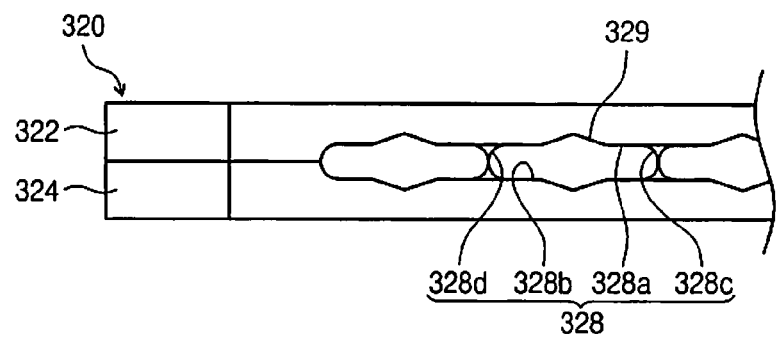
FIG. 17A is a bottom view illustrating discharging openings including extension portions, according to an embodiment of the present invention.
Figure 17B:
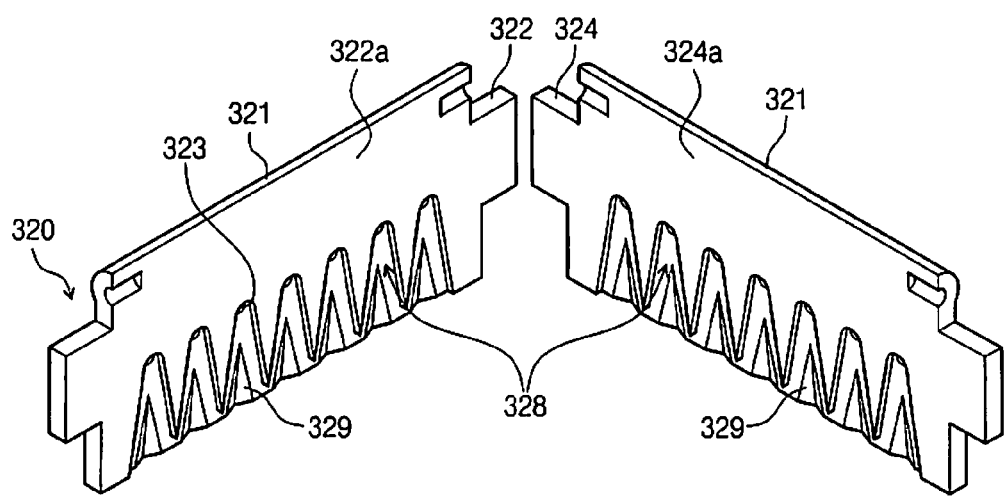
FIG. 17B is a perspective view illustrating coupling surfaces of a first plate and a second plate including discharging openings having extension portions, according to an embodiment of the present invention.

FIG. 17A is a bottom view illustrating discharging openings including extension portions 329. FIG. 17B is a perspective view illustrating coupling surfaces of the first plate 322 and the second plate 324 including the discharging openings having the extension portions 329.

Referring to FIGS. 17A and 17B, the centers respectively of the discrete discharging openings S1 of the nozzle main body 320 are provided with the extension portions 329 having widths greater than the widths of the discrete discharging openings S1. The extension portions 329 are provided by forming triangle indentations in the first and second inner surfaces 328a and 328b corresponding to the long sides of the discrete discharging openings S1.

FIG. 18A through 18E are perspective views illustrating discharge cross sections of developing liquid discharged from various shapes of the discrete discharging openings S1.

Figure 18A:
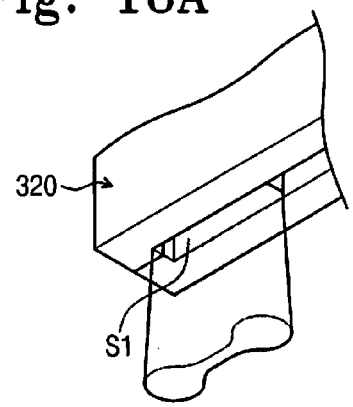
FIG. 18A through 18E are perspective views illustrating discharge cross sections of developing liquid discharged from various shapes of discrete discharging openings, according to an embodiment of the present invention.

Referring to FIG. 18A, a discharge cross section of developing liquid will now be described when the discrete discharging opening S1 has straight ends. The developing liquid is conglomerated at both the ends of the discrete discharging opening S1 by its surface tension, so that the widths of the discharge cross section at the ends are excessively increased. Furthermore, the width of the discharge cross section at the middle portion except for the ends is excessively decreased, thus degrading discharge uniformity.

Figure 18B:
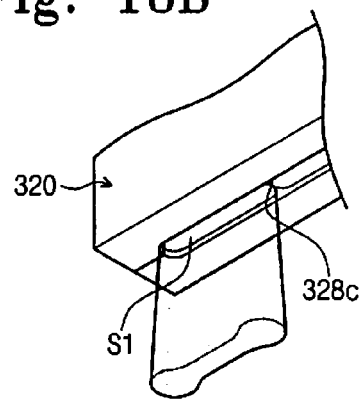

To prevent the excessive width variation of the discharge cross section, the shape of the discrete discharging opening S1 is modified. Referring to FIG. 18B, when the ends 328c and 328d of the discrete discharging opening S1 are round, developing liquid is still conglomerated at the ends 328c and 328d, but the widths of discharge cross section at the ends 328c and 328d are decreased, and the lengths thereof are increased, thus reducing slimming in the middle of the discharge cross section.

Figure 18C:
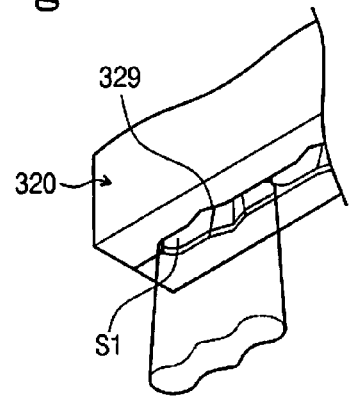
Figure 18D:
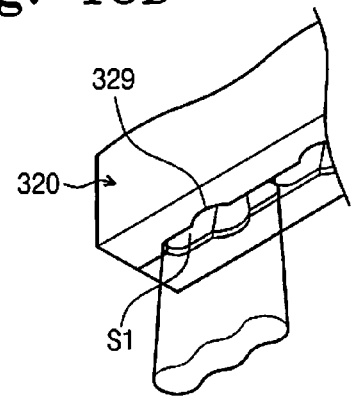
Figure 18E:
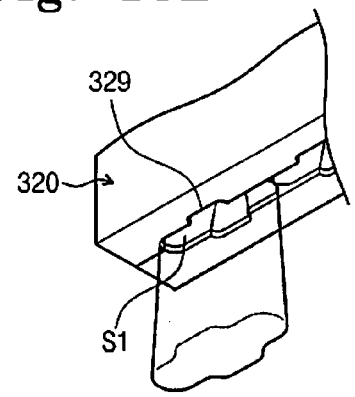

Referring to FIGS. 18C through 18E, the discrete discharging opening S1 has round ends, and includes the extension portion 329 in the middle thereof. The extension portion 329 has a width greater than that of the discrete discharging opening S1. The extension portion 329 is provided by forming indentations (triangle, oval, or tetragonal indentations) in the first and second inner surfaces 328a and 328b corresponding to the long sides of the discrete discharging opening S1. As such, the extension portion 329 is disposed in the middle of the discrete discharging opening S1 to prevent slimming in the longitudinal direction of the discrete discharging opening S1, thus improving discharge uniformity.

According to the embodiment of the present invention, the uniformity of a developing process and line width uniformity are improved.

According to the embodiment of the present invention, developing liquid is sequentially discharged from the edge of a substrate to the center thereof without moving a nozzle, thus obtaining the same effect as that of a nozzle moved to discharge developing liquid to a substrate.

According to the embodiment of the present invention, a process time is reduced to increase a process amount of substrates.

According to the embodiment of the present invention, processing liquid consumption is reduced.

According to the embodiment of the present invention, the discharging process with the nozzle in liquid contact with a substrate and the discharging process with the nozzle spaced apart from a substrate are selectively used.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate processing apparatus comprising:
    a substrate supporting member including a spin head on which a substrate is placed;
    a nozzle discharging processing liquid to the substrate placed on the spin head, the nozzle including a plurality of discrete discharging openings having a slit-shaped cross section and arrayed in series in a predetermined direction, wherein each of the discrete discharging openings has an extension portion at a middle, and the extension portion has a width greater than that of the width of the slit-shaped cross section; and
    a processing liquid supplying source supplying the processing liquid to the nozzle,
    wherein each of the discrete discharging openings discretely discharges the processing liquid.

2. The substrate processing apparatus of claim 1, wherein each of the discrete discharging openings has round surfaces at both ends in a longitudinal direction of the discrete discharging opening.

3. The substrate processing apparatus of claim 1, wherein the nozzle comprises:
    a main passage connected to the processing liquid supplying source;
    branch passages respectively connected to the discrete discharging openings from the main passage; and
    valves respectively provided to the branch passages.

4. The substrate processing apparatus of claim 1, wherein the nozzle comprises:
    a distributor configured to distribute the processing liquid to each of the discrete discharging openings; and
    a controlling part controlling the distributor.

5. The substrate processing apparatus of claim 4, wherein the distributor comprises:
    a main passage connected to the processing liquid supplying source;
    branch passages connecting the main passage to each of the discrete discharging openings; and
    valves opening and closing the branch passages according to signals provided from the controlling part.

6. The substrate processing apparatus of claim 4, wherein the discrete discharging openings have neighboring side surfaces that are in surface contact with each other, and
    a sum of lengths of the discrete discharging openings is equal to or greater than a radius of the substrate, and less than a diameter of the substrate.

7. A substrate processing apparatus comprising:
    a substrate supporting member including a spin head on which a substrate is placed;
    a nozzle discharging processing liquid to the substrate placed on the spin head; and
    a processing liquid supplying source supplying the processing liquid to the nozzle,
    wherein the nozzle includes a nozzle main body that has a plurality of discrete discharging openings and an integration discharging opening,
    the discrete discharging openings have a slit-shaped cross section having a first length and are arrayed in series in a predetermined direction, and
    the integration discharging opening is formed by connecting the discrete discharging openings to each other in a single slot shape having a length greater than the first length, and finally discharges the processing liquid.

8. The substrate processing apparatus of claim 7, further comprising:
    an arm on which the nozzle is rotatably installed to adjust a discharge angle of the processing liquid discharged from the integration discharging opening; and
    an angle adjusting driving part adjusting the discharge angle of the nozzle installed on the arm.

9. The substrate processing apparatus of claim 8, wherein the integration discharging opening has a length that is equal to or greater than a radius of the substrate, and less than a diameter of the substrate.

10. The substrate processing apparatus of claim 8, wherein a discharge position of the nozzle extends along an eccentric line parallel to and spaced a predetermined distance from a center line connecting an edge of the substrate to a rotation center of the substrate.

11. The substrate processing apparatus of claim 7, wherein the nozzle main body has first and second inner surfaces corresponding to a long side of the discrete discharging opening, and third and fourth round inner surfaces corresponding to a short side thereof.

12. The substrate processing apparatus of claim 11, wherein the first and second inner surfaces have an extension portion having a width greater than that of the slit-shaped cross section.

13. The substrate processing apparatus of claim 7, wherein the nozzle comprises:
    a distributor connected to the nozzle main body and configured to distribute the processing liquid, supplied from the processing liquid supplying source, to each of the discrete discharging openings; and
    a nozzle controlling part controlling the distributor.

14. The substrate processing apparatus of claim 13, wherein the distributor comprises:
    a main passage connected to the processing liquid supplying source;
    branch passages connecting the main passage to each of the discrete discharging openings; and
    valves opening and closing the branch passages according to signals provided from the nozzle controlling part.

15. The substrate processing apparatus of claim 13, wherein the nozzle controlling part controls the distributor to adjust a discharge start time point and a discharge end time point of each of the discrete discharging openings.

16. The substrate processing apparatus of claim 13, wherein the discrete discharging openings disposed at both ends of the nozzle main body discharge the processing liquid to an edge region of the substrate and a center region of the substrate.

* * * * *